United States Patent
Ohashi et al.

(10) Patent No.: US 10,321,619 B2
(45) Date of Patent: Jun. 11, 2019

(54) FEEDER

(71) Applicant: FUJI CORPORATION, Chiryu-shi (JP)

(72) Inventors: Hiroyasu Ohashi, Toyota (JP); Hiroki Murase, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/535,754

(22) PCT Filed: Dec. 18, 2014

(86) PCT No.: PCT/JP2014/083619
§ 371 (c)(1),
(2) Date: Jun. 14, 2017

(87) PCT Pub. No.: WO2016/098235
PCT Pub. Date: Jun. 23, 2016

(65) Prior Publication Data
US 2017/0347502 A1 Nov. 30, 2017

(51) Int. Cl.
*H05K 13/04* (2006.01)
*H05K 13/02* (2006.01)

(52) U.S. Cl.
CPC ....... *H05K 13/0417* (2013.01); *H05K 13/021* (2013.01); *H05K 13/022* (2013.01); *H05K 13/0419* (2018.08); *H05K 13/0452* (2013.01)

(58) Field of Classification Search
CPC ..... B65H 20/20; B65H 20/22; H05K 13/0417
See application file for complete search history.

(56) References Cited

U.S. PATENT DOCUMENTS

| | | | | |
|---|---|---|---|---|
| 7,850,040 | B2 * | 12/2010 | Davis | H05K 13/0417 221/72 |
| 2010/0256819 | A1 * | 10/2010 | Song | H05K 13/0417 700/275 |
| 2011/0243695 | A1 * | 10/2011 | Hwang | H05K 13/0417 414/412 |
| 2015/0382523 | A1 * | 12/2015 | Hwang | H05K 13/0417 414/412 |

FOREIGN PATENT DOCUMENTS

| | | |
|---|---|---|
| JP | 63-44407 A | 2/1988 |
| JP | 2011-211169 A | 10/2011 |
| JP | 2014-11216 A | 1/2014 |
| JP | 2014-11291 A | 1/2014 |
| JP | 2014-41859 A | 3/2014 |

OTHER PUBLICATIONS

International Search Report dated Mar. 24, 2015, in PCT/JP2014/083619, filed Dec. 18, 2014.

* cited by examiner

*Primary Examiner* — Michael C McCullough
(74) *Attorney, Agent, or Firm* — Oblon, McClelland, Maier & Neustadt, L.L.P.

(57) ABSTRACT

A feeder provided with: a feeder main body, on a rear section of which is formed a tape insertion section for inserting carrier tape that stores multiple components; a tape feeding path for feeding the carrier tape from rear to front, the tape feeding path being provided on the feeder main body so as to connect to the tape insertion section; and an insertion guiding member in which is formed a guiding groove capable of guiding the carrier tape to the tape insertion section when the carrier tape is inserted to the tape insertion section.

13 Claims, 16 Drawing Sheets

FEEDER

TECHNICAL FIELD

The present disclosure relates to a feeder for feeding carrier tape in which components are stored.

BACKGROUND ART

Disclosed in patent literature 1 is an auto loading type feeder that automatically feeds carrier tape and starts using the carrier tape. A tape insertion section for inserting the leading end of the carrier tape and a sprocket that feeds the inserted carrier tape to a front section of the feeder main body are provided on a rear section of the feeder main body of the feeder. This feeder is set in advance in multiple slots provided on a component supply section of a component mounter.

An operator pulls out carrier tape wound on a reel set on a reel holding section provided in front of the slot. Then, the operator inserts the leading end of the carrier tape into the tape insertion section. By this, the carrier tape is automatically fed by the rotation of the sprocket.

CITATION LIST

Patent Literature

PTL 1: JP-A-2011-211169

SUMMARY

Problem to be Solved

Because the feeder is set in advance in a slot positioned to the rear of the reel holding section, when inserting the leading end of the carrier tape into the tape insertion section from the rear of and diagonally above the feeder, it is difficult for the operator to see, making tape insertion work troublesome.

The present disclosure takes account of such problems and an object thereof is to provide a feeder for which it is easy to insert the leading end of a carrier tape into a tape insertion section provided on a rear section of a feeder main body.

Means for Solving the Problem

To solve the above problems, a feeder of the present disclosure includes: a feeder main body, on a rear section of which is formed a tape insertion section for inserting a carrier tape that stores multiple components; a tape feeding path for feeding the carrier tape from rear to front, the tape feeding path being provided on the feeder main body so as to connect to the tape insertion section; and an insertion guiding member in which is formed a guiding groove capable of guiding the carrier tape to the tape insertion section when the carrier tape is inserted to the tape insertion section.

Because an insertion guiding member that guides the carrier tape to the tape insertion section is provided at a rear section of the feeder main body, an operator can easily insert the carrier tape to the tape insertion section.

DESCRIPTION OF EMBODIMENTS

Configuration of Component Mounter

Figure 1:
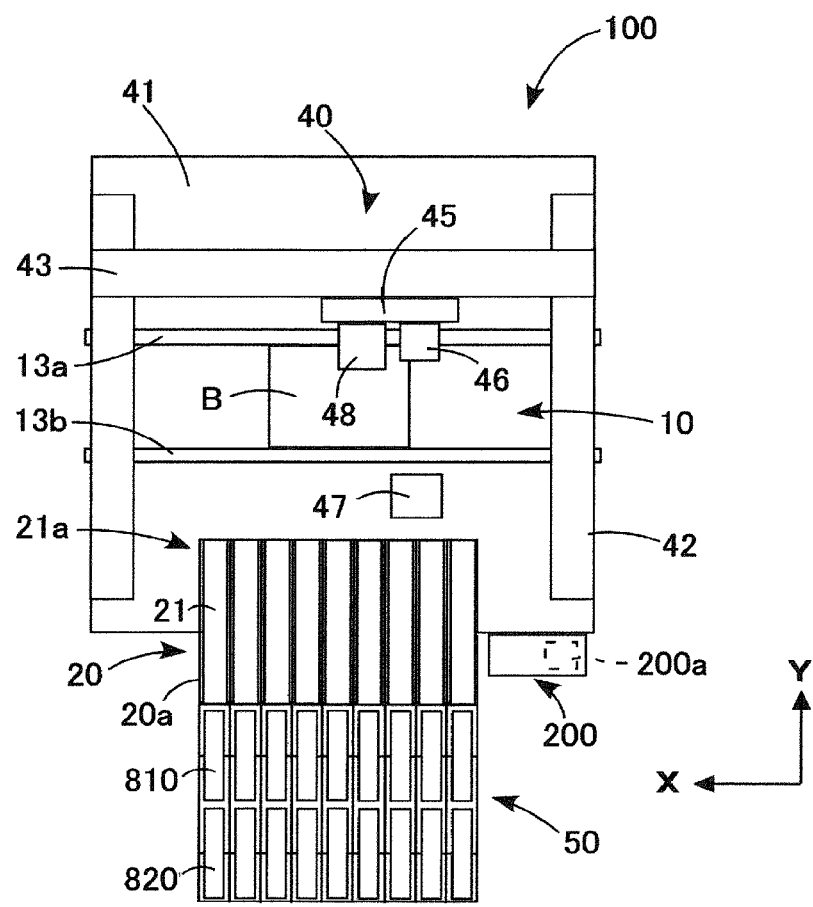
FIG. 1 is an overall plan view of a component mounter that is a suitable embodiment of the invention.

An embodiment of the present disclosure is described below with reference to the figures. FIG. 1 shows component mounter 100 provided with feeders 21; component mounter 100 includes board conveyance section 10, component supply section 20, component mounting section 40, reel holding section 50, and control device 200 that controls those items. In the following description, the X-axis direction refers to the conveyance direction of boards, and the Y-axis direction refers to the horizontal direction orthogonal to the X-axis direction.

As shown in FIG. 1, component supply section 20 is formed from multiple slots 20a and multiple feeders 21 which are detachably mounted to each of the slots 20a. Slots 20a are provided in component supply section 20 lined up in parallel in the X-axis direction. First reel 810 and second reel 820 on which carrier tapes 900 (refer to FIG. 2) are wound are exchangeably held on reel holding section 50. First reel 810 and second reel 820 are arranged adjacent to each other in the Y direction, and multiple of the reels are arranged in the X direction corresponding to each of the feeders 21.

Details are described later, but carrier tapes 900 wound on first reel 810 and second reel 820 are able to be inserted into each feeder 21. The carrier tape 900 wound on one of the reels, reel 810 (reel 820), is sequentially indexed by feeder 21 to component pickup position 21a provided at the tip section of feeder 21. By this, a component held in the carrier tape 900 is positioned at component pickup position 21a.

Further, carrier tape 900 which is wound on the other reel, reel 820 (reel 810), stands by without being supplied by feeder 21.

Note that, below, to facilitate description, in order to distinguish between carrier tape 900 which is being indexed (in use) and carrier tape which is standing by, there are cases in which the former is referred to as a first carrier tape 900A and the latter is referred to as a second carrier tape 900B. In these cases, since the second carrier tape becomes the first carrier tape after all of the components which are stored in the first carrier tape are used, the terms first carrier tape and second carrier tape do not indicate a specific carrier tape.

Figure 2:
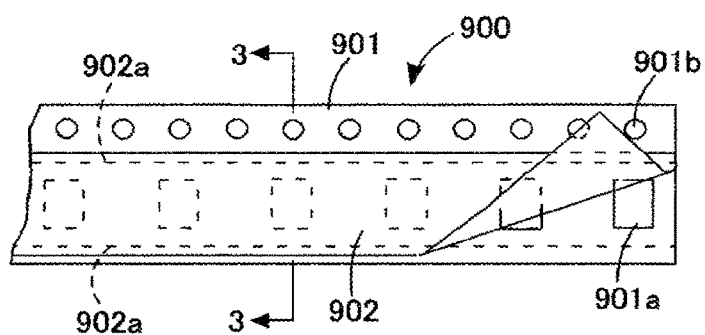
FIG. 2 is a plan view of carrier tape.
Figure 3:
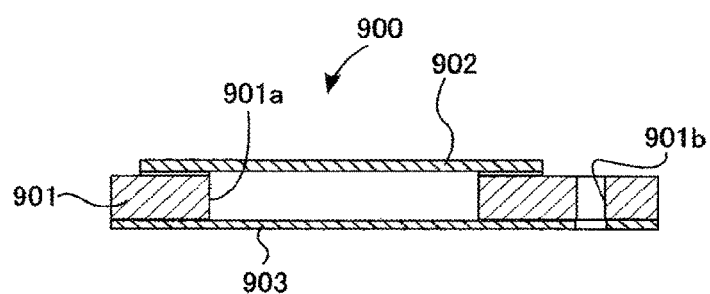
FIG. 3 is a cross section of the carrier tape shown in FIG. 2 at line 3-3.

As shown in FIGS. 2 and 3, multiple components, for example electronic components, are stored in a row in carrier tape 900. Carrier tape 900 is configured from base tape 901, cover tape 902, and bottom tape 903. Base tape 901 is formed of a flexible material such as a paper material or a resin. Storage sections 901a, which are cavities, are formed as through-holes in a center portion of base tape 901 in the width direction at a fixed interval in the length direction. Components are stored in storage sections 901a. Engagement holes 901b are formed as through-holes in a side portion of the base tape 901 at a fixed interval in the length direction.

As shown in FIG. 2, both side portions of cover tape 902 are adhered to both side portions of the top surface of base tape 901 using an adhesive 902a, and usually cover tape 902 covers the upper section of storage sections 901a. Components stored in storage sections 901a are prevented from coming out by cover tape 902. Cover tape 902 is formed from a transparent polymer film. As shown in FIG. 3, bottom tape 903 is adhered to the bottom surface of base tape 901. Components stored in storage sections 901a are prevented from falling out by bottom tape 903. Bottom tape 903 is formed of a transparent or semi-transparent paper or polymer film or the like.

As shown in FIG. 1, in board conveyance section 10, a pair of guide rails 13a and 13b are provided on base 41 of component mounting device 40. Also, conveyor belts, not shown, that support and convey a printed circuit board B that is guided by both of the guide rails 13a and 13b, and a clamp device, not shown, that raises board B that has been conveyed to a specified position, are provided in board conveyance section 10. Board B on which components are to be mounted is conveyed in the X-axis direction to a component mounting position by the conveyor belts while being guided by guide rails 13a and 13b of board conveyance section 10. Printed circuit board B that is conveyed to the component mounting position is positioned and clamped in the component mounting position by the clamp device.

Component mounting section 40 includes guide rail 42, Y-axis slide 43, X-axis slide 45, and component mounting head 48 that holds a suction nozzle, which is not shown. The movement of Y-axis slide 43 and X-axis slide 45 in the Y-axis direction and the X-axis direction is controlled by a Y-axis servo motor and an X-axis servo motor which are omitted from the drawings. A Y-axis robot is formed by guide rail 42 and Y-axis slide 43. Guide rail 42 is mounted in the Y-axis direction above base 41 and is arranged to be above board conveyance section 10. Y-axis slide 43 is provided to be capable of moving in the Y-axis direction along guide rail 42. Y-axis slide 43 is moved in the Y-axis direction via a ball screw mechanism by the Y-axis servo motor, which is omitted from the drawings.

An X-axis robot is formed by X-axis slide 45. X-axis slide 45 is provided to be capable of moving in the X-axis direction on Y-axis slide 43. An X-axis servo motor, not shown, is provided on Y-axis slide 43. X-axis slide 45 is moved in the X-axis direction via a ball screw mechanism by the X-axis servo motor. Component mounting head 48 is provided on X-axis slide 45. Component mounting head 48 holds multiple suction nozzles (not illustrated in the drawings) in a detachable manner. Each suction nozzle picks up a component fed to component supply position 21a and mounts the component on board B, which is positioned at the component mounting position by board conveyance section 10.

Board camera 46 is attached to X-axis slide 45. Board camera 46 images fiducial marks that are provided on board B positioned at the board mounting position, or a component or the like which supplied to component supply position 21a, from above, and acquires board position fiducial information, component position information, and the like. Component camera 47 capable of imaging a component that has been picked up by the suction nozzle from beneath is provided on base 41.

Control device 200 controls feeder 21 and controls the rotation of first servo motor 22 and second servo motor 23 of feeders 21, described below. Control device 200 includes a microprocessor and a driver that supplies the drive currents to servo motors 22 and 23. When feeder 21 is inserted into slot 20a of component supply section 20, electric power is supplied to feeder 21 from the main body side of component mounter 100 via a communication connector, not shown, and required information such as the feeder ID is sent from feeder 21 to control device 200 of component mounter 100. By this, information of the component fed by carrier tape 900 mounted in feeder 21 is acquired based on the serial ID of feeder 21 and stored in control device 200.

Configuration of Feeder

Next, the configuration of feeder 21 is described with reference to FIGS. 4 to 7. Feeder 21 is configured mainly from feeder main body 21b, rail 38 as a tape feeding path, entrance retaining member 32, first sprocket 61 and second sprocket 62 as front-side sprockets, third sprocket 63 and fourth sprocket as rear-side sprockets, operation lever 51, insertion guiding member 110, discharge guiding member 120, positioning device 130, and so on. Note that, FIGS. 4 and 7 are diagrams with a side wall of feeder main body 21b removed to show the internal structure of feeder 21.

Figure 4:
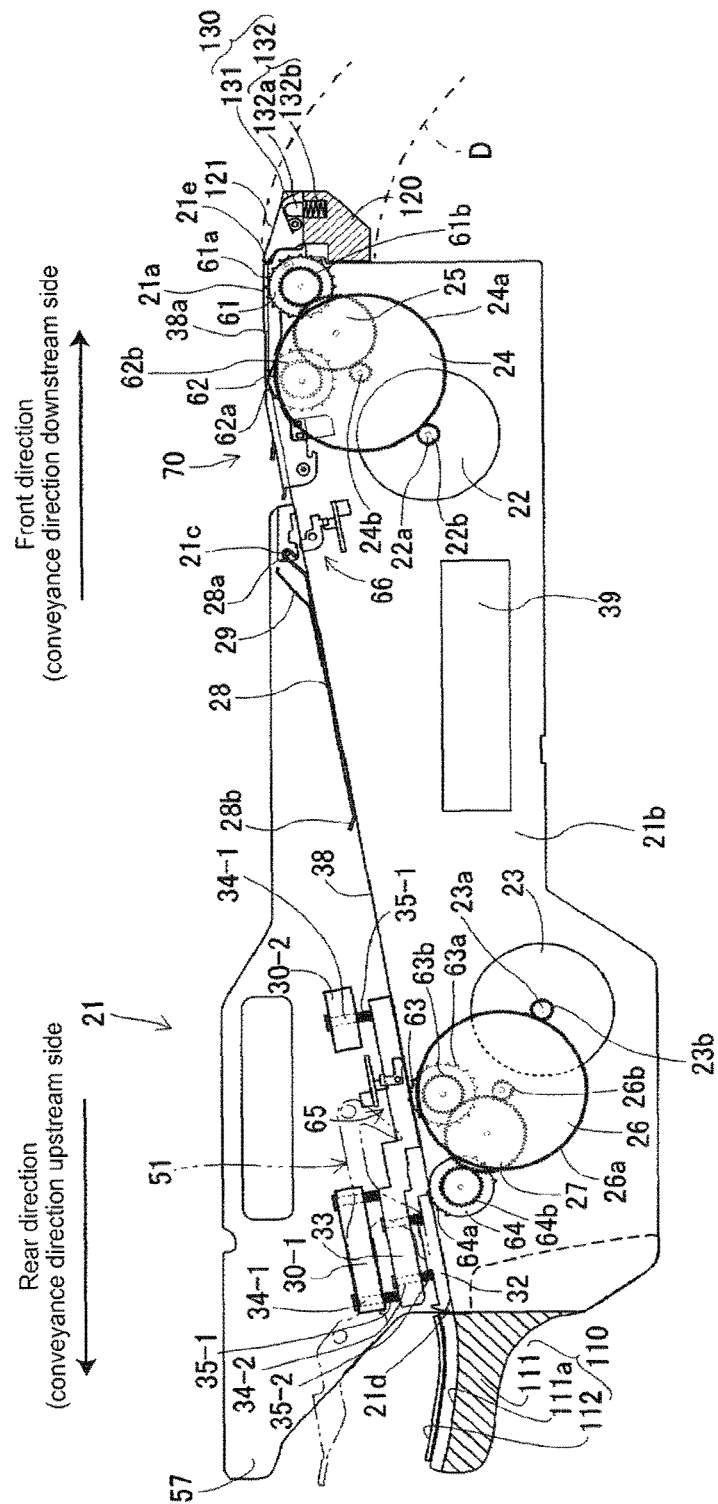
FIG. 4 is a cutaway side view of a feeder of an embodiment of the invention.

As shown in FIG. 4, feeder main body 21b is a flat box shape. Tape insertion section 21d for inserting carrier tape 900 is formed at a rear section on feeder main body 21b, and tape discharge section 21e for discharging carrier tape 900 is formed at a front section of feeder main body 21b. Tape insertion section 21d is formed as an entrance to tape feeding path 38 that has a width the same as the width of tape feeding path (rail) 38; tape discharge section 21e is formed as an entrance of tape feeding path 38 that has a width the same as the width of tape feeding path 38.

Tape feeding path 38 is provided on feeder main body 21b connected to tape insertion section 21d and tape discharge section 21e and is for conveying carrier tape 900 from the rear to the front of feeder main body 21b. Front section 38a of tape feeding path 38 is formed to be horizontal. In the present embodiment, tape feeding path 38 is inclined to gradually increase in height from the rear section to before front section 38a. Note that, although not shown, guide sections that are separated by a dimension which is slightly greater than the width dimension of carrier tape 900 are provided on both sides of tape feeding path 38.

Entrance retaining member 32 pushes carrier tape 900 inserted into tape insertion section 21d towards tape feeding path 38, is arranged along the upper surface of the rear section of tape feeding path 38 close to tape insertion section 21d, and is detachable from tape feeding path 38. Entrance retaining member 32 is attached so as to be movable in a vertical direction via pair of shafts 34-2 downwards from the rear section of downstream-side retaining member 33. Springs 35-2 that bias entrance retaining member 32 downward are attached to pair of shafts 34-2.

Downstream-side retaining member 33 pushes on carrier tape 900 at the downstream side to entrance retaining member 32, and is detachable from tape retaining path 38. Downstream-side retaining member 33 is attached to first support member 30-1 and second support member 30-2, which are attached to main body 21b, via shaft 34-1 so as to be capable of moving in the vertical direction. Spring 35-1 that biases downstream-side retaining member 33 downward is attached to shaft 34-1.

First sprocket 61 and second sprocket 62 are provided to be capable of rotating from the front toward the rear (from the downstream side to the upstream side in the feeding direction) in feeder main body 21b beneath front section 38a of tape feeding path 38, that is, in positions adjacent to component pickup position 21a of feeder main body 21b. Third sprocket 63 and fourth sprocket 64 are provided to be capable of rotating from the front toward the rear in feeder main body 21b beneath the rear section of tape feeding path 38.

Engaging protrusions 61a, 62a, and 63a are formed at a fixed angle all the way around the outer circumferences of first sprocket 61, second sprocket 62, and third sprocket 63, respectively. Fourth engaging protrusions 64a are formed at an interval of 180 degrees on a portion of the outer circumference of fourth sprocket 64. That is, between each engaging protrusion 64a of fourth sprocket 64, there is a portion where no engaging protrusions are formed. Each of the engaging protrusions 61a to 64a is able to engage with engagement holes 901b of carrier tape 900.

First sprocket gear 61b, second sprocket gear 62b, third sprocket gear 63b, and fourth sprocket gear 64b are respectively formed closer to the inside than the outer circumference of the first sprocket 61 to the fourth sprocket 64. A window, not shown in the drawings, is provided in tape feeding path 38 above each sprocket 61 to 64, and each engaging protrusion 61a to 64a penetrates through tape feeding path 38 through this window.

First servo motor 22 rotates first sprocket 61 and second sprocket 62. First drive gear 22b is provided on rotating shaft 22a of first servo motor 22. First gear 24 is rotatably provided on main body 21b beneath first sprocket 61 and second sprocket 62. First outside gear 24a that meshes with first drive gear 22b is formed on the outer circumference of first gear 24. First inside gear 24b is formed closer to the inside than the outer circumference of first gear 24.

Second gear 25 is rotatably provided on main body 21b between first sprocket 61 and second sprocket 62, and first gear 24. Second gear 25 meshes with first sprocket gear 61b, second sprocket gear 62b, and first inside gear 24b. According to such a configuration, the rotation speed of first servo motor 22 is reduced and transmitted to first sprocket 61 and second sprocket 62, and, first sprocket 61 and second sprocket 62 rotate in synchronization.

Second servo motor 23 rotates third sprocket 63 and fourth sprocket 64. Second drive gear 23b is provided on rotating shaft 23a of second servo motor 23. Third gear 26 is rotatably provided on main body 21b beneath third sprocket 63 and fourth sprocket 64. Third outside gear 26a that meshes with second drive gear 23b is formed on the outer circumference of third gear 26. Third inside gear 26b is formed closer to the inside than the outer circumference of third gear 26.

Fourth gear 27 is rotatably provided on main body 21b between third sprocket 63 and fourth sprocket 64, and third gear 26. Fourth gear 27 meshes with third sprocket gear 63b, fourth sprocket gear 64b, and third inside gear 26b. According to such a configuration, the rotation speed of second servo motor 23 is reduced and transmitted to third sprocket 63 and fourth sprocket 64, and, third sprocket 63 and fourth sprocket 64 rotate in synchronization.

As shown in FIG. 7, operation lever 51 is rotatably supported around pivot 52 on the rear section of feeder main body 21b so as to protrude to the rear and higher than tape insertion section 21d. Lever operation grip section 57 (refer to FIG. 4) is formed higher than operation lever 51 to protrude to the rear from the rear section of feeder main body 21b. Operation lever 51 is formed such that the pivot 52 side is stored in lever operation grip section 57 and the operation knob 51b side protrudes from level operation grip section 57, such that an operator can easily grip lever operation grip section 57 in the palm of their hand and operate operation knob 51b with a finger.

As described later, entrance retaining member 32 is operationally connected to operation lever 51. Engaging member 54 is provided on entrance retaining member 32 between pair of shafts 34-2. Operation engaging section 51a that engages with the lower surface of engaging member 54 of entrance retaining member 32 is formed in the central section of operation lever 51. Operation lever 51 is rotated in a counterclockwise direction in FIG. 5 by the biasing force of spring 55, and usually operation engaging section 51a is held at a lower position, with entrance retaining member 32 contacting tape feeding path 38 due to the biasing force of springs 35-2. Thus, usually, carrier tape 900 is unable to be inserted into tape insertion section 21d due to entrance retaining member 32.

However, when operation knob 51b provided an the rear end of operation lever 51 is raised by an operator, operation lever 51 is rotated against the biasing force of spring 55, such that entrance retaining member 32 is raised against the biasing force of springs 35-2 via operation engaging section 51a. By this, entrance retaining member 32 is raised up and separated from tape feeding path 38, such that carrier tape 900 is able to be inserted into tape insertion section 21d.

Figure 8:
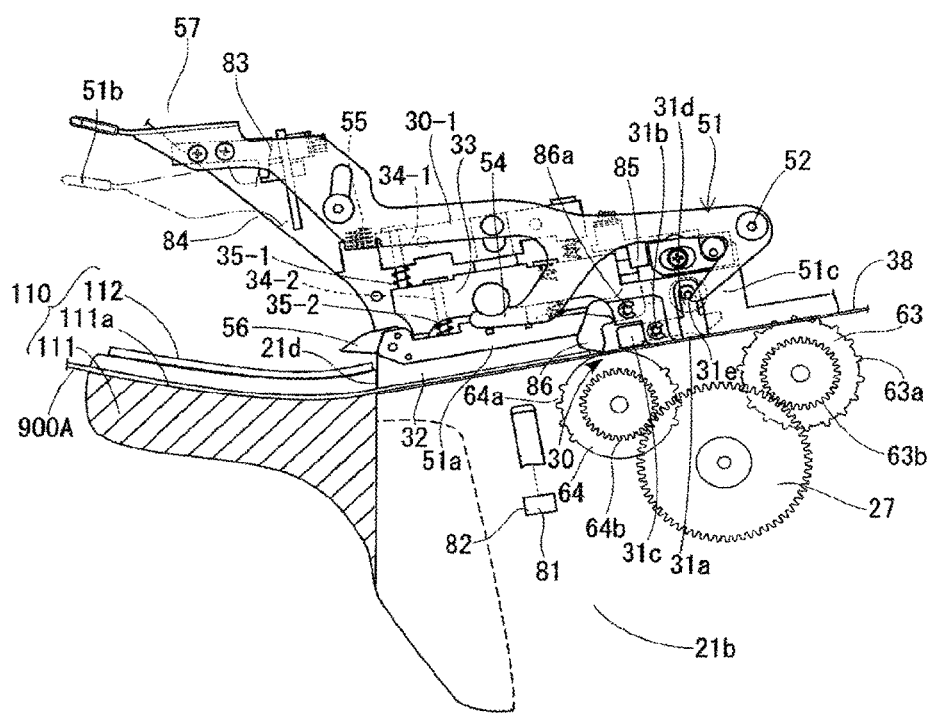
FIG. 8 shows an operating state of FIG. 7 with the operation lever raised.

Obstructing plate 56 that covers tape entrance section 21d is hinged on the rear section of entrance retaining member 32. Obstructing plate 56 prevents carrier tape 900 from being able to be inserted between tape feeding path 38 and entrance retaining member 32. Note that, when entrance retaining member 32 is raised, as shown in FIG. 8, obstructing plate 56 engages with the rear section of downstream-side retaining member 33 and rotates to open tape entrance section 21d.

Stopper member 31 is provided adjacent to and contacting the downstream side of entrance retaining member 32. Stopper member 31 is able to rotate by shaft support section 31b provided in the central portion of stopper member 31 being supported by downstream-side retaining member 33. Abutting section 31a is formed protruding downward on the bottom portion of stopper member 31 closer to the front than shaft support portion 31b. The rear end of stopper member 31 is stopping section 31c.

A spring 36, not shown, that biases abutting section 31a to contact tape feeding path 38 is attached between downstream-side retaining member 33 and stopper member 31. Protruding section 31d that protrudes up is formed on the upper section of stopper member 31 further to the front than shaft support section 31b, and cam follower 31e is provided on the end of protruding section 31d. Cam section 51c formed in the front section of operation lever 51 is able to engage with and separate from cam follower 31e.

Operation lever 51 is rotated in the counterclockwise direction shown in FIG. 7 by the biasing force of spring 55 and in a state in which entrance retaining member 32 contacts tape feeding path 38, cam section 51c formed on operation lever 51 is separated from cam follower 31e of stopper member 31. By this, stopper member 31 is rotated clockwise as in FIG. 7 around shaft support section 31b by the biasing force of spring 36, such that abutting section 31a contacts tape feeding path 38 and stopping section 31c is held at a position separated from tape feeding path 38.

On the other hand, when operation lever 51 is rotated against the biasing force of spring 55, cam section 51c formed on operation lever 51 engages with cam follower 31e of stopper member 31 so as to rotate stopper member 31 in a counterclockwise direction as in FIG. 7 against the biasing force of a spring, not shown, such that stopping section 31c contacts tape feeding path 38. By this, in a state with operation lever 51 rotated against the biasing force of spring 55, when first carrier tape 900A is inserted into tape insertion section 21d, the leading end of first carrier tape 900A contacts stopping section 31c of stopper member 31 so as to be stopped at a specified position.

Note that, when first carrier tape 900A passes between abutting section 31a of stopper member 31 and tape feeding path 38, abutting section 31a is raised by first carrier tape 900A and stopping section 31c of stopper member 31 contacts tape feeding path 38. Thus, in this state, when second carrier tape 900B is inserted by an operator into tape insertion section 21d on top of first carrier tape 900A, the leading end of carrier tape 900B is stopped by contacting stopping section 31c of stopper member 31. By this, feeding downstream of second carrier tape 900B is prevented and second carrier tape 900B stands by at that position.

Insertion guiding member 110 is provided extending in the protruding direction of operation lever 51 from tape insertion section 21d. An operator, when inserting the leading end of carrier tape 900 into tape insertion section 21d, must check the position of tape insertion section 21d diagonally from above and from the rear of feeder 21. However, because operation lever 51 and lever operation grip section 57 are above tape insertion section 21d, the view of the operator is blocked, meaning it is difficult to see tape insertion section 21d, which makes work troublesome. Thus, insertion guiding member 110 that guides carrier tape 900 to tape insertion section 21d when carrier tape 900 is inserted into tape insertion section 21d is provided on a rear section of feeder main body 21b.

Figure 5:
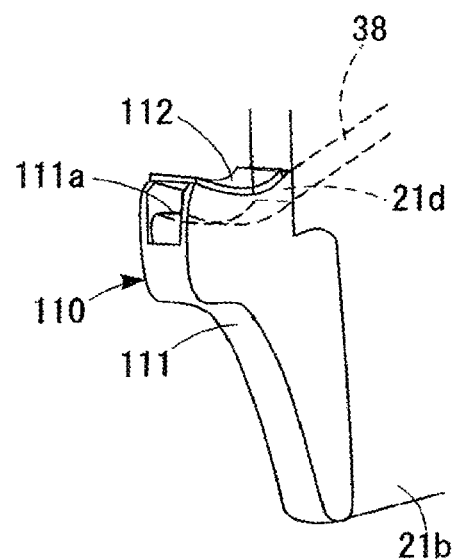
FIG. 5 is a perspective view of the insertion guiding member of the feeder.

As shown in FIGS. 4, 5, and 7, insertion guiding section 110 is provided with groove forming member 111 and lid 112. Guiding groove 111a is formed on groove forming member 111 from a rear section to a front section of groove forming member 111. Guiding groove 111a is open at the rear end and the front end and is formed such that carrier tape 900 is inserted into the rear end and inserted carrier tape 900 runs from the opening at the front end to tape feeding path 38 through tape insertion section 21d.

The groove width of guiding groove 111a is formed in the horizontal width direction of tape insertion section 21d such that carrier tape 900 does not contact the edge sections in the horizontal direction of insertion section 21d when passing through tape insertion section 21d. The bottom section of guiding groove 111a is formed to be positioned on the same horizontal plane as the bottom section of tape insertion section 21d such that carrier tape 900 does not contact the bottom section of tape insertion section 21d when passing through insertion section 21d.

Conventionally, carrier tape 900, when pulled from a reel 810 or 820 in a position offset to feeder 21, is inserted diagonally into tape insertion section 21d, making it more likely that unstable tape feeding will occur. However, with the present embodiment, because carrier tape 900 passes through guiding groove 111a of groove forming member 111, the diagonal state is corrected by guiding groove 111a before the carrier tape is inserted into tape insertion section 21d, making stable tape feeding possible.

Lid 112 is provided on an upper section of guiding groove 111a, and is formed from a transparent or semi-transparent material such that the upper surface of carrier tape 900 inserted into guiding groove 111a is visible. Because the inside of guiding groove 111a can be seen through lid 112, it is easy to insert the leading end of carrier tape 900 into guiding groove 111a, and it is possible to visually check that insertion has been performed correctly. Also, because lid 112 covers guiding groove 111a, carrier tape 900 passing through guiding groove 111a is prevented from coming out of guiding groove 111a.

As shown in FIGS. 4 and 7, the rear end of insertion guiding member 110 is positioned forward of the rear end of operation lever 51, and is provided below operation lever 51 separated by a gap. Because insertion guiding member 110 does not protrude further to the rear of feeder 21 than operation lever 51, feeder 21 can still have a compact configuration even when provided with insertion guiding member 110. Also, because insertion guiding member 110 and operation lever 51 are separated, insertion guiding member 110 does not interfere with lever operation, and carrier tape 900 can be easily inserted into guiding groove 111a of insertion guiding member 110. Further, because insertion guiding member 110 and operation lever 51 are separated, it is easy to visually check inserted carrier tape 900.

As shown in FIG. 4, discharge guiding member 120 is provided on a front section of feeder main body 21d and is for guiding carrier tape 900 discharged from tape discharge section 21e downwards inside discharge duct D. When carrier tape 900 is passing through tape feeding path 38, movement except in the feeding direction is restricted, but movement is allowed in directions other than the feeding direction when carrier tape 900 has been discharged from tape discharge section 21e.

Therefore, carrier tape 900 may rise up from tape discharge section 21e when being discharged, possibly hindering component mounting. Therefore, provided on a front section of feeder main body 21b is discharge guiding member 120 with tape retaining section 121 that pushes down and guides carrier tape 900 such that carrier tape 900 is forced down when carrier tape 900 is discharged from tape discharge section 21e.

Figure 6:
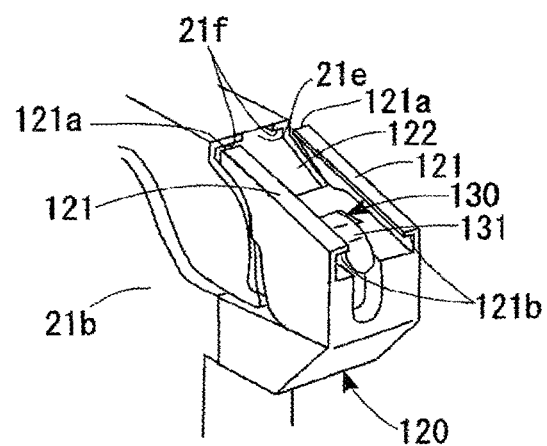
FIG. 6 is a perspective view of the discharge guiding member and the positioning device of the feeder.
Figure 7:
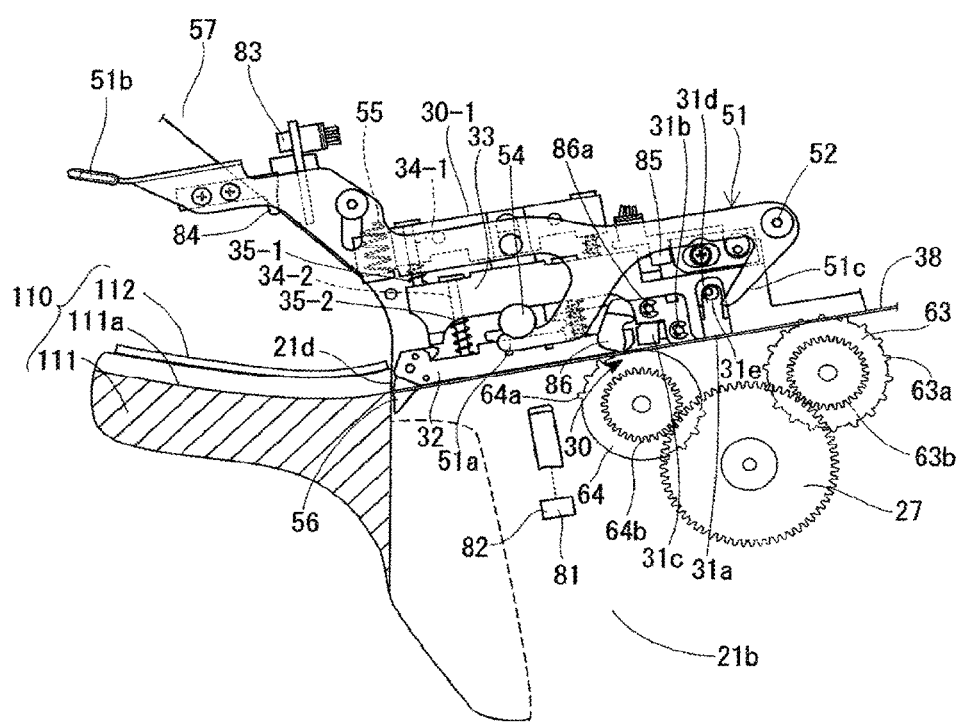
FIG. 7 is a detailed view showing the insertion guiding member of the feeder and surrounding portions.

As shown in FIG. 6, slit 122 is provided in the discharge direction of carrier tape 900 on tape retaining section 121 of discharge guiding member to prevent components getting stuck. Tape retaining section 121 functions to guide and prevent from rising up carrier tape 900 that is being discharged. Tape retainer section 121 is formed such that, when the leading end of carrier tape 900 is discharged from tape discharge section 21e, the leading end of carrier tape 900 goes downwards along ceiling guiding surface 121b of tape retaining section 121 without contacting end section 121a of tape retaining section 121 on the tape discharge section 21e side. That is, tape retaining section 121 is formed such that ceiling guiding surface 121b starts at the same height as ceiling surface 121f of tape discharge section 21e, and then gradually goes diagonally downwards towards the front.

Figure 10:
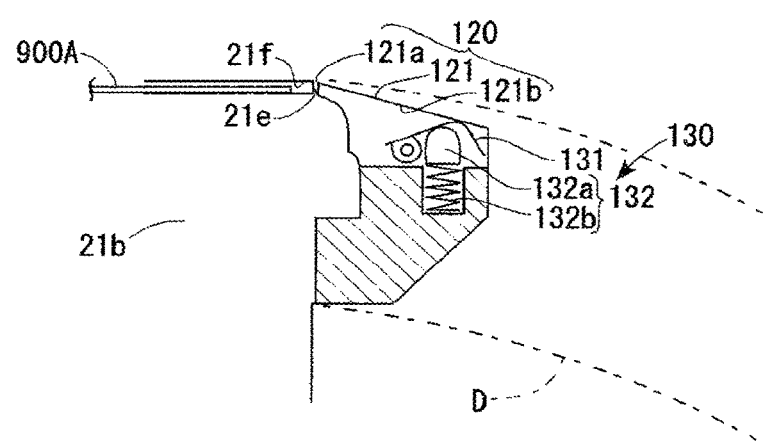
FIG. 10 shows the discharge guiding member and the positioning device when a first carrier tape starts being fed.

As shown in FIGS. 4 and 10, positioning device 130 is provided on discharge guiding member 120 and is for positioning carrier tape 900 that is discharged from tape discharge section 21e at a specified position inside discharge guiding member 120. When first carrier tape 900A has been used up, first carrier tape 900A is released from first sprocket 61 and the trailing end of first carrier tape 900A is discharged from tape discharge section 21e. At this time, if first carrier tape 900A is stopped inside discharge guiding member 120 in a discharged state, the leading end of second carrier tape 900B contacts the trailing end of first carrier tape 900A and pushes first carrier tape 900A inside discharge duct D.

However, because the inside of discharge guiding member 120 is formed as a hollow for supporting various component sizes, there are cases in which discharged first carrier tape 900A is deviated downwards inside discharge guiding member 120. In this case, the leading end of second carrier tape 900B cannot contact the trailing end of first carrier tape 900A, and first carrier tape 900A cannot be pushed into discharge duct D. If this situation continues, carrier tape 900 that cannot be discharged accumulates inside discharge guiding member 120, and there is a worry that carrier tape 900 in use will jam.

Therefore, provided on a front section of feeder main body 21b is positioning device 130 that positions carrier tape 900 being discharged from tape discharge section 21e at a specified position inside discharge guiding member 120, that is, at a position at which the leading end of carrier tape 900 in use can contact the trailing end of carrier tape 900 being discharged.

Positioning device 130 is provided with pressing member 131 and elastic member 132. Pressing member 131 presses carrier tape 900 against ceiling guiding surface 121b of tape retaining section 121 of discharge guiding member 120 by the elastic force of elastic member 132. As elastic member 132, compression coil spring 132b provided with block 132a at one end is compact and reliably applies elastic force to pressing member 131. Pressing member 131 is formed as a bent plate with one end at right angles to the discharge direction of carrier tape 900 and supported to be rotatable around a horizontal axis line, and the other end extending in the discharge direction of carrier tape 900 and capable of pressing carrier tape 900 against discharge guiding member 120.

In the present embodiment, the other end of pressing member 131 is formed with an R-shaped upwards protrusion. Positioning device 130 pushes the lower surface of carrier tape 900, the upper surface of which is being guided by ceiling guiding surface 121b of tape retaining section 121, and by pushing the upper surface of carrier tape 90 against ceiling guiding surface 121b of tape retaining section 121, carrier tape 900 is positioned at the above-mentioned specified position inside discharge guiding member 120.

As shown in FIG. 7, first sensor 81 that detects when first carrier tape 900A is inserted into tape insertion section 21d is attached to feeder main body 21b. First sensor 81 turns on by first dog 82 that protrudes from the lower surface of tape feeding path 38 being lowered by the insertion of first carrier tape 900A. First dog 82 is usually held in a position protruding from the lower surface of tape feeding path 38 by the biasing force of a spring, not shown, and is pressed down when first carrier tape 900A is inserted.

Further, second sensor 83 that detects that operation lever 51 has been rotated, and third sensor 85 that operates when second carrier tape 900B is fed on tape feeding path 38 above fourth sprocket 64, are attached to feeder main body 21b. Second sensor 83 is turned on by second dog 84 attached to operation lever 51. Third sensor 85 is turned on by the rotation of third dog 86.

Third dog 86 is able to rotate by shaft support section 86a provided in the central portion of third dog 86 being supported by downstream-side retaining member 33. Third dog 86 is usually biased in a counterclockwise direction as in FIG. 7 by a spring, which is not shown. By this, the leading end of third dog 86 contacts the upper surface of tape feeding path 38 when there is no carrier tape 900 on tape feeding path 38, and the leading end of third dog 86 contacts the upper surface of first carrier tape 900A when there is a first carrier tape 900A on tape feeding path 38.

As shown in FIG. 4, fourth sensor 65 that detects the presence or absence of carrier tape 900 and outputs that detection signal to control section 39 is provided in main body 21b on the downstream side of third sprocket 63 (the rear end side of feeder 21). Fourth sensor 65 is a sensor that detects a boundary portion between first carrier tape 900A and second carrier tape 900B. Fifth sensor 66 that detects the presence or absence of carrier tape 900 and outputs that detection signal to control section 39 is provided in main body 21b on the upstream side of second sprocket 62 (the front end side of feeder 21).

Lifting prevention member 28 is provided along the top of tape feeding path 38 between third sprocket 63 and second sprocket 62. Shaft support portion 28a is formed on the front end of lifting prevention member 28, and shaft support portion 28a is axially supported on shaft portion 21c that is provided in main body 21b, and, lifting prevention member 28 is attached to main body 21b to be capable of rocking. Guide section 28b, which is bent upward, is formed on the rear end of lifting prevention member 28. Torsion spring 29 is attached to main body 21b above lifting prevention member 28 and biases lifting prevention member 28 downward. The bottom surface of lifting prevention member 28 comes into close contact with the top surface of tape feeding path 38 due to torsion spring 29.

Tape peeling device 70 is provided on an upper front section of feeder main body 21b, and peels cover tape 902 from carrier tape 900 such that a component is able to be removed from storage section 901a positioned at component pickup position 21a.

Feeder Operation

Operation of feeder 21 of the above embodiment is described next with reference to FIGS. 7 to 15. Here, first carrier tape 900A is wound around front-side reel 810, and second carrier tape 900B is wound around rear-side reel 820. Normally, operation lever 51 is held in the position shown in FIG. 7 by the biasing force of spring 55, entrance retaining member 32 contacts tape feeding path 38, and obstructing plate 56 rotates under its own weight to cover tape entrance section 21d.

In this state, as shown in FIG. 8, operation knob 51b of operation lever 51 is raised by an operator. When operation lever 51 is raised, second sensor 83 is operated by second dog 84 to detect operation of operation lever 51. Entrance retaining member 32 is raised by the rotation of operation lever 51 via operation engaging section 51a.

By this, entrance retaining member 32 is separated from tape feeding path 38, and obstructing plate 56 is rotated by downstream-side retaining member 33. As a result, tape insertion section 21d is opened, and carrier tape 900 is able to be inserted. At the same time, by the rotation of operation lever 51, stopper member 31 is rotated by cam section 51$c$, and stopping section 31$c$ contacts tape feeding path 38.

In this state, the leading end of first carrier tape 900A is inserted by an operator into guiding groove 111$a$ of insertion guiding member 110, and is further inserted onto tape feeding path 38 through tape insertion section 21$d$. Because an operator can easily visually check guiding groove 111$a$ of insertion guiding member 110 that protrudes to the rear, the leading end of carrier tape 900 can be easily inserted into guiding groove 111$a$, and it is easy to determine whether insertion has been performed correctly.

Also, because the groove width of guiding groove 111$a$ is formed as the width in the horizontal direction of tape insertion section 21$d$, and the bottom section of guiding groove 111$a$ is formed to be on the same horizontal plane as the bottom section of tape insertion section 21$d$, an operator can smoothly insert first carrier tape 900A onto tape feeding path 38 from guiding groove 111$a$ through tape insertion section 21$d$. First carrier tape 900A is inserted to a specified position at which the leading end of the tape contacts stopping section 31$c$ of stopper member 31. By this, because first dog 82 and third dog 86 are operated by first carrier tape 900A, first sensor 81 and third sensor 85 are activated such that it is detected that first carrier tape 900A has been inserted to the specified position.

When first carrier tape 900A is inserted to a position contacting stopping section 31$c$, operation of operation lever 51 is released, and operation lever 51 rotates, returning to its original position as shown by a two-dot chain line in FIG. 8 due to the biasing force of spring 55. By the return of operation lever 51, entrance retaining member 32 is lowered towards tape feeding path 38, and the inserted first carrier tape 900A is pressed towards tape feeding path 38.

Figure 9:
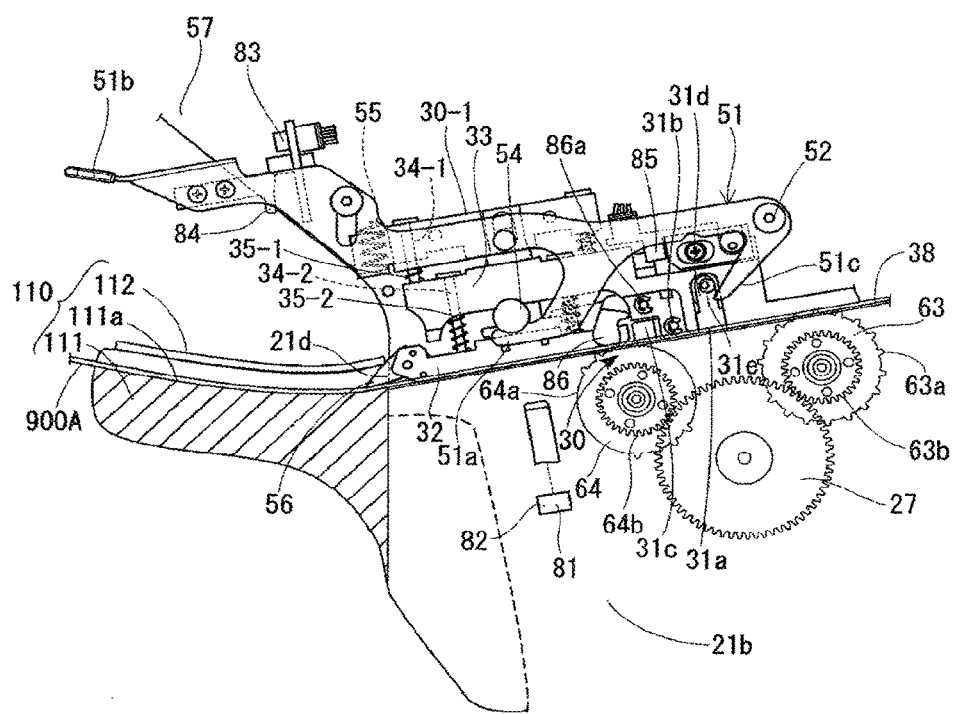
FIG. 9 shows an operating state of FIG. 7 in which the carrier tape is being fed.

As shown in FIG. 9, when the insertion of first carrier tape 900A is detected and the return of operation lever 51 to its original position is detected (second sensor 83 is off), second servo motor 23 is driven such that third and fourth sprockets 63 and 64 rotate. By this, engaging protrusion 64$a$ of fourth sprocket 64 engages with engaging hole 901$b$ of first carrier tape 900A, and first carrier tape 900A is fed by fourth sprocket 64 to the third sprocket 63 side.

Due to the feeding of first carrier tape 900A by fourth sprocket 64, downstream-side retaining member 33 is raised by first carrier tape 900A against the biasing force of spring 35-1, and first carrier tape 900A is fed between downstream-side retaining member 33 and tape feeding path 38.

In this case, because engaging protrusions 64$a$ of fourth sprocket 64 are only formed in a portion of the outer circumference of fourth sprocket 64, when engaging protrusions 64$a$ engage with engaging hole 901$b$ of first carrier tape 900A, first carrier tape 900A is moved intermittently to the third sprocket 63 side. As a result, first carrier tape 900A is not suddenly taken up to the third sprocket 63 side. Note that, when downstream-side retaining member 33 is raised by first carrier tape 900A, shaft support sections 31$b$ and 86$a$ of stopper member 31 and third dog 86 are raised as one body.

When engaging holes 901$b$ formed in first carrier tape 900A fed by fourth sprocket 64 engage with engaging protrusions 63$a$ of third sprocket 63, first carrier tape 900A is fed to the second sprocket 62 side by third sprocket 63. Because engaging protrusions 63$a$ are formed along the entire circumference of the outer circumference of third sprocket 63, first carrier tape 900A is fed to the second sprocket 62 side in a short time.

Further, the leading end of first carrier tape 900A enters beneath lifting prevention member 28 from between guide section 28$b$ and tape feeding path 38. The leading end of first carrier tape 900A is suppressed from lifting up from tape feeding path 38 by lifting prevention member 28 and is fed to second sprocket 62. When fifth sensor 66 detects the leading end of first carrier tape 900A conveyed thereto by third sprocket 63, first servo motor 22 and second servo motor 23 intermittently rotate sprockets 61 to 64 by the component pitch.

When engaging holes 901$b$ formed in first carrier tape 900A engage with engaging protrusions 62$a$ of second sprocket 62, first carrier tape 900A is fed to tape peeling device 70 by second sprocket 62 and cover tape 902 is peeled from first carrier tape 900A by tape peeling device 70. Then, when engagement holes 901$b$ formed in first carrier tape 900A engage with engaging protrusions 61$a$ of first sprocket 61, components stored in first carrier tape 900A are sequentially positioned at component pickup position 21$a$ by first sprocket 61.

Figure 11:
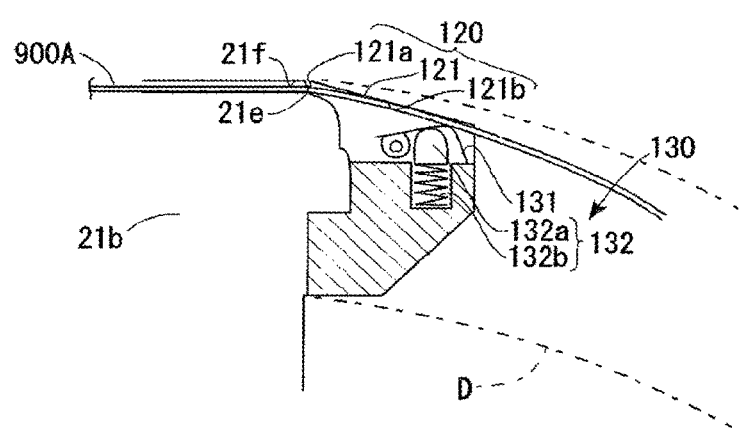
FIG. 11 shows the discharge guiding member and the positioning device when a first carrier tape is being fed.

As shown in FIGS. 10 and 11, the leading end of first carrier tape 900A is guided diagonally downwards along ceiling guiding surface 121$b$ of tape retaining section 121 of discharge guiding member 120 through tape discharge section 21$e$, and contacts pressing member 131 of positioning device 130. The leading end of first carrier tape 900A pushes up pressing member 131 against the elastic force of elastic member 132, and is inserted between pressing member 131 and ceiling guiding surface 121$b$ of tape retaining 121.

Also, the upper surface of first carrier tape 900A is guided by ceiling guiding surface 121$b$ of tape retaining section 121, and the lower surface of first carrier tape 900A is pushed up by pressing member 131 such that the upper surface of first carrier tape 900A is pressed against ceiling guiding surface 121$b$ of tape retaining section 121. By this, first carrier tape 900A is maintained at the specified position along ceiling guiding surface 121$b$ of tape retaining section 121, and is gradually discharged downwards into discharge duct D.

When first carrier tape 900A is fed by feeder 21, as shown in FIG. 9, first carrier tape 900A presses on abutting section 31$a$ of stopper member 31 such that stopper member 31 rotates against the biasing force of spring 36. By this, stopping section 31 of stopper member 31 contacts the upper surface of first carrier tape 900A.

In that state, as described above, operation lever 51 is rotated (second sensor 83 turns on), the leading end of second carrier tape 900B is inserted into guiding groove 111$a$ of insertion guiding member 110, and is further inserted through tape insertion section 21$d$ between first carrier tape 900A and entrance retaining member 32. When this is done, the leading end of second carrier tape 900B contacts stopping section 31$c$ of stopper member 31 and second carrier tape 900B is stopped at that position.

By this, feeding downstream of second carrier tape 900B is prevented and second carrier tape 900B stands by at that position. When second carrier tape 900B has been inserted to a position contacting stopping section 31$c$ of stopper member 31, because third dog 86 is operated by second carrier tape 900B, the insertion of second carrier tape 900B is detected by third sensor 85.

After the insertion of second carrier tape 900B, when operation of operation lever 51 is released, operation lever 51 returns to its original position, but because first carrier tape 900A is pressed against abutting section 31$a$ of stopper member 31, second carrier tape 900B remains in a stopped state due to stopping section 31$c$ of stopper member 31.

Note that, even if second carrier tape 900B is inserted into tape insertion section 21d without rotating operation lever 51, the insertion of second carrier tape 900B is prevented by obstructing plate 56 that contacts the upper surface of first carrier tape 900A (refer to FIG. 9).

When the trailing end of first carrier tape 900A is fed downstream further than the leading end of second carrier tape 900B, engaging holes 901b formed in second carrier tape 900B engage with engaging protrusions 64a of fourth sprocket 64. Then, second carrier tape 900B progresses into the gap between tape feeding path 38 and stopper member 31 created by first carrier tape 900A, and is fed towards second sprocket 62. Note that, when the leading end of second carrier tape 900B pushes up abutting section 31a, as described above, stopper member 31 is again rotated against the biasing force of spring 36, such that insertion of a new carrier tape 900 is presented by stopper member 31.

Figure 12:
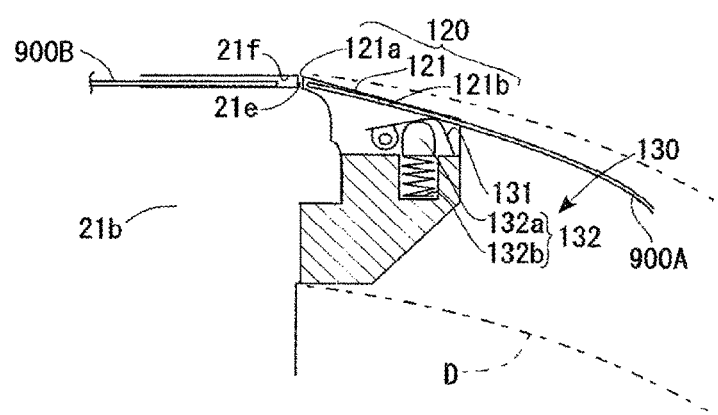
FIG. 12 shows the discharge guiding member and the positioning device when the first carrier tape has finished being used and a second carrier tape starts being fed.

As shown in FIG. 12, when all the components have been removed from first carrier tape 900A, first carrier tape 900A is released from first sprocket 61 and the trailing end of first carrier tape 900A is discharged from tape discharge section 21e. At this time, because first carrier tape 900A is being raised up by pressing member 131 to be pushed against ceiling guiding surface 121b of tape retaining section 121, first carrier tape 900A is maintained in the specified position along ceiling guiding surface 121b of tape retaining section 121.

Figure 13:
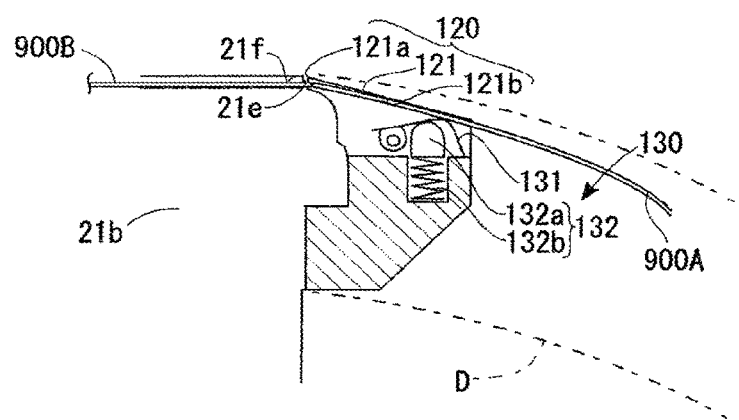
FIG. 13 shows the discharge guiding member and the positioning device when the leading end of the second carrier tape starts contacting the trailing end of the first carrier tape.
Figure 14:
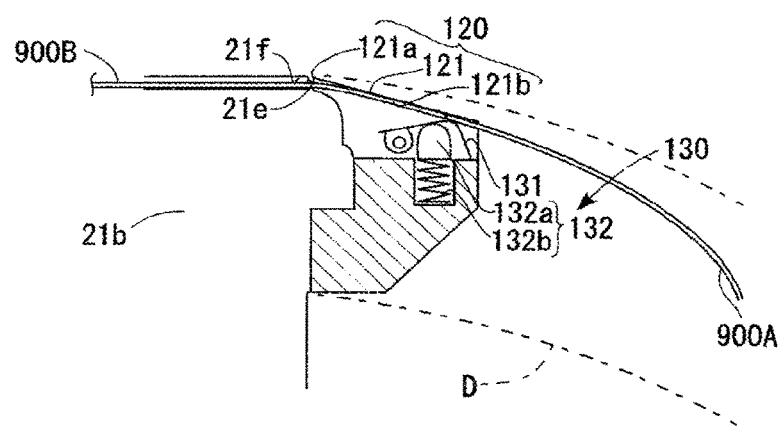
FIG. 14 shows the discharge guiding member and the positioning device when the first carrier tape has finished being used and a second carrier tape starts being fed.
Figure 15:
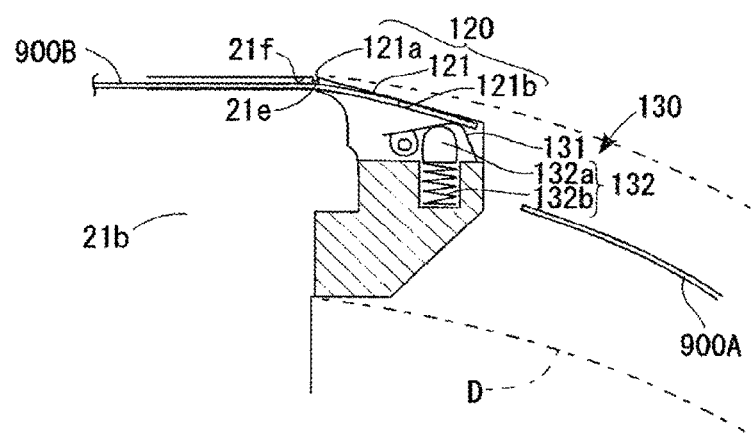
FIG. 15 shows the discharge guiding member and the positioning device when the first carrier tape has dropped down due to being pushed by the second carrier tape.

As shown in FIG. 13, because first carrier tape 900A is positioned at the specified position along ceiling guiding surface 121b of tape retaining section 121, the leading end of second carrier tape 900B reliably contacts the trailing end of first carrier tape 900A. And, as shown in FIG. 14, first carrier tape 900A is pushed by second carrier tape 900B as first sprocket 61 rotates. Also, as shown in FIG. 15, when the trailing end of first carrier tape 900A separates from pressing member 131, first carrier tape 900A falls into discharge duct D.

The leading end of second carrier tape 900B is guided diagonally downwards along ceiling guiding surface 121b of tape retaining section 121 of discharge guiding member 120 through tape discharge section 21e, and contacts pressing member 131 of positioning device 130. The leading end of second carrier tape 900B pushes up pressing member 131 against the elastic force of elastic member 132, and is inserted between pressing member 131 and ceiling guiding surface 121b of tape retaining 121.

Also, the upper surface of second carrier tape 900B is guided by ceiling guiding surface 121b of tape retaining section 121, and the lower surface of second carrier tape 900B is pushed up by pressing member 131 such that the upper surface of second carrier tape 900B is pressed against ceiling guiding surface 121b of tape retaining section 121. By this, second carrier tape 900B is maintained at the specified position along ceiling guiding surface 121b of tape retaining section 121, and is discharged downwards into discharge duct D. Subsequently, the same operation is repeated until component mounting is complete.

Effects

Feeder 21 of the above-described embodiment includes: feeder main body 21b, on a rear section of which is formed tape insertion section 21d for inserting carrier tape 900 that stores multiple components; tape feeding path 38 for feeding carrier tape 900 from rear to front, tape feeding path 38 being provided on feeder main body 21b so as to connect to tape insertion section 21d; and insertion guiding member 110 in which is formed guiding groove 111a capable of guiding carrier tape 900 to tape insertion section 21d when carrier tape 900 is inserted to tape insertion section 21d.

An operator, when inserting the leading end of carrier tape 900 into tape insertion section 21d, must check the position of tape insertion section 21d diagonally from above and from the rear of feeder 21. However, because tape insertion section 21d is formed at a relatively deep position, it is difficult for an operator to visually check tape insertion 21d, which makes work troublesome. Because insertion guiding member 110 that guides carrier tape 900 to tape insertion section 21d is provided at a rear section of feeder main body 21b, an operator can easily insert carrier tape 900 to tape insertion section 21d.

Also, because insertion guiding member 110 is formed such that an upper surface of carrier tape 900 inserted into guiding groove 111a is visible, an operator can reliably insert the leading end of carrier tape 900 into tape insertion section 21d. Further, insertion guiding member 110 is provided with groove forming member 111 in which guiding groove 111a is formed, and lid 112 provided on an upper section of guiding groove 111a such that the upper surface of carrier tape 900 inserted into guiding groove 111a is visible. By this, insertion guiding member 110 and reel 810 on which carrier tape 900 is wound are arranged in an offset manner, such that carrier tape 900 is prevented from coming out of guiding groove 111a even if carrier tape 900 is fed from reel 810 diagonally with respect to guiding groove 111a. Also, because the groove width of guiding groove 111a is formed as the width of tape insertion section 21d, an operator can smoothly insert carrier tape 900 into tape insertion section 21d.

Further, feeder 21 includes entrance retaining member 32 that is provided on feeder main body 21b and that pushes carrier tape 900 inserted into tape insertion section 21d towards tape feeding path 38. Feeder 21 also includes: sprocket 64 that is rotatably provided on feeder main body 21b, has engaging protrusion 64a that is engageable with engaging holes 901b of carrier tape 900 inserted into tape insertion section 21d and pushed by entrance retaining member 32, and feeds the carrier tape 900 along tape feeding path 38; and rotatable operation lever 51 provided on the rear section of feeder main body 21b so as to protrude to the rear and higher than tape insertion section 21d, operation lever 51 raising entrance retaining member 32 when carrier tape 900 is inserted into tape insertion section 21d. And, insertion guiding member 110 is provided to extend from tape insertion section 21d in the protruding direction of operation lever 51 and to be below operation lever 51 separated by a gap, such that the rear end of insertion guiding member 110 is positioned forwards of the rear end of operation lever 51.

As such, because insertion guiding member 110 does not protrude further to the rear of feeder 21 than operation lever 51, feeder 21 can still have a compact configuration even when provided with insertion guiding member 110. Also, because insertion guiding member 110 and operation lever 51 are separated, insertion guiding member 110 does not interfere with lever operation, and carrier tape 900 can be easily inserted into guiding groove 111a of insertion guiding member 110. Further, because insertion guiding member 110 and operation lever 51 are separated, it is easy to visually check inserted carrier tape 900.

Also, feeder main body 21b is provided with lever operation grip section 57 provided to the rear and above tape insertion section 21d, lever operation grip section 57 storing a portion of operation lever 51. Visually checking tape insertion section 21d becomes even harder due to the presence of lever operation grip section 57, but an operator can smoothly insert carrier tape 900 from insertion guiding member 110 into tape insertion section 21*d*.

Other

In the above embodiment, insertion guiding member 110 is configured as a separate body to feeder main body 21*b*, but may be configured as a single body with feeder main body 21*b*. Also, guiding groove 111*a* is configured to be covered by lid 112, but may be configured without lid 112. Further, discharge guiding member 120 is configured as a separate body to feeder main body 21*b*, but may be configured as a single body with feeder main body 21*b*.

Figure 16:
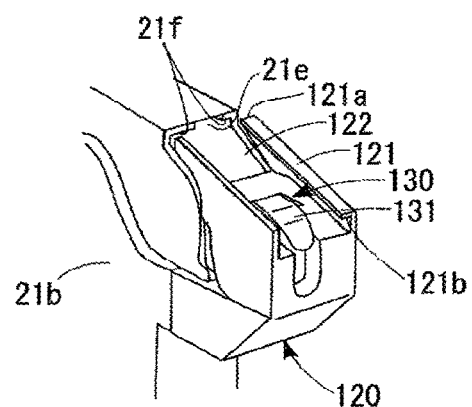
FIG. 16 is a perspective view of the discharge guiding member and the positioning device of an alternative embodiment of the feeder.

Also, tape retaining section 121 of discharge guiding member 120 is configured on both sides of slit 122, but as shown in FIG. 16, may be configured on just one side of slit 122. By this, the rear end section of first carrier tape 900A being discharged, due to tape retaining section 121 and positioning device 130, raises to the side without tape retaining section 121 and accumulates diagonal to the width direction. Accordingly, the leading end of second carrier tape 900B is discharged in a horizontal state, and more reliably contacts the trailing end of first carrier tape 900 that is in a diagonal state, such that first carrier tape 900A falls inside discharge duct D.

Also, pressing member 131 of positioning device 130 is configured such that the other end extends in the discharge direction of carrier tape 900, but may be configured in the opposite direction, that is, extending in the tape discharge section 21*e* direction. By this, the size of discharge guiding member 120 in the discharge direction is smaller. Also, the other end of pressing member 131 is formed with an R-shaped upwards protrusion, but may be formed as a curved protrusion, a block-shaped protrusion, and so on. Further, positioning device 130 does not require elastic member 132, and may be configured only with pressing member 131 made from a plate spring. Also, the configuration may be just elastic member 132, without pressing member 131. Or, instead of compressed coil spring 132*b* of elastic member 132, an item with elastic force such as rubber or an air damper may be configured.

The present disclosure is not limited to the configuration described in the embodiments described above, and various embodiments may be adopted within a scope that does not depart from the gist of the present disclosure described in the claims.

REFERENCE SIGNS LIST

21: feeder; 21*b*: feeder main body; 21*d*: tape insertion section; 32: entrance retaining member; 38: tape feeding path; 51: operation lever; 57: lever operation grip section; 64: sprocket; 64*a*: engaging protrusion; 95: contact prevention device; 100: component mounter; 110: insertion guiding member; 111: groove forming member; 111*a*: guiding groove; 112: lid; 120: discharge guiding member; 121: tape retaining section; 121*b*: guiding ceiling surface; 122: slit; 130: positioning device; 131: pressing member; 132: elastic member; 132*a*: block; 132*b*: compression coil spring; 900: carrier tape; 901*b*: engaging hole

The invention claimed is:

1. A feeder comprising:
   a feeder main body, on a rear section of which is formed a tape insertion section to insert a carrier tape that stores multiple components;
   a tape feeding path to feed the carrier tape from rear to front, the tape feeding path being provided on the feeder main body so as to connect to the tape insertion section;
   an insertion guide in which is formed a guiding groove to guide the carrier tape to the tape insertion section when the carrier tape is inserted to the tape insertion section;
   an entrance retainer provided on the feeder main body, the entrance retainer pressing the carrier tape inserted to the tape insertion section towards the tape feeding path; and
   a lever provided so as to protrude in a rear direction above the tape insertion section at a rear section of the feeder main body, the lever being rotatable so as to raise the entrance retainer when the carrier tape is inserted to the tape insertion section,
   wherein
   a rear end of the insertion guide is positioned in front of a rear end of the lever.

2. The feeder according to claim 1, wherein
   the insertion guide is formed such that an upper surface of the carrier tape inserted into the guiding groove is visible.

3. The feeder according to claim 2, wherein
   the insertion guide is provided with a groove forming structure in which the guiding groove is formed, and a lid provided on an upper section of the guiding groove such that an upper surface of the carrier tape inserted into the guiding groove is visible.

4. The feeder according to claim 2, wherein a groove width of the guiding groove is formed as a width of the tape insertion section.

5. The feeder according to claim 1, wherein a groove width of the guiding groove is formed as a width of the tape insertion section.

6. A feeder according to claim 1, further comprising:
   a sprocket rotatably provided on the feeder main body, the sprocket having an engaging protrusion that is engagable with an engaging hole of the carrier tape that is inserted to the tape insertion section and pressed by the entrance retainer, so as to feed the carrier tape along the tape feeding path.

7. The feeder according to claim 6, wherein
   the feeder main body is provided with a lever operation grip section provided to the rear and above the tape insertion section, the lever operation grip section storing a portion of the lever.

8. A feeder comprising:
   a feeder main body, on a rear section of which is formed a tape insertion section to insert a carrier tape that stores multiple components;
   a tape feeding path to feed the carrier tape from rear to front, the tape feeding path being provided on the feeder main body so as to connect to the tape insertion section;
   an insertion guide in which is formed a guiding groove to guide the carrier tape to the tape insertion section when the carrier tape is inserted to the tape insertion section;
   an entrance retainer provided on the feeder main body, the entrance retainer pressing the carrier tape inserted to the tape insertion section towards the tape feeding path;
   a sprocket rotatably provided on the feeder main body, the sprocket having an engaging protrusion that is engagable with an engaging hole of the carrier tape that is inserted to the tape insertion section and pressed by the entrance retainer, so as to feed the carrier tape along the tape feeding path; and a lever provided so as to protrude in a rear direction above the tape insertion section at a rear section of the feeder main body, the lever being rotatable so as to raise the entrance retainer when the carrier tape is inserted to the tape insertion section, wherein the insertion guide is provided to extend from the tape insertion section a direction in which the lever protrudes via a gap under the lever, such that a rear end of the insertion guide is positioned in front of a rear end of the lever.

9. The feeder according to claim 8, wherein a groove width of the guiding groove is formed as a width of the tape insertion section.

10. The feeder according to claim 8, wherein the feeder main body is provided with a lever operation grip section provided to the rear and above the tape insertion section, the lever operation grip section storing a portion of the lever.

11. The feeder according to claim 8, wherein the insertion guide is formed such that an upper surface of the carrier tape inserted into the guiding groove is visible.

12. The feeder according to claim 11, wherein the insertion guide is provided with a groove forming structure in which the guiding groove is formed, and a lid provided on an upper section of the guiding groove such that an upper surface of the carrier tape inserted into the guiding groove is visible.

13. The feeder according to claim 11, wherein a groove width of the guiding groove is formed as a width of the tape insertion section.

* * * * *